(12) United States Patent
Marohl et al.

(10) Patent No.: US 8,318,609 B2
(45) Date of Patent: *Nov. 27, 2012

(54) METHOD OF DEPOSITING MATERIALS ON A NON-PLANAR SURFACE

(75) Inventors: Dan Marohl, San Jose, CA (US);
Timothy J. Franklin, Sunnyvale, CA (US); Ratson Morad, Palo Alto, CA (US)

(73) Assignee: Solyndra LLC, Fremont, CA (US)

( * ) Notice: Subject to any disclaimer, the term of this patent is extended or adjusted under 35 U.S.C. 154(b) by 257 days.

This patent is subject to a terminal disclaimer.

(21) Appl. No.: 12/633,589

(22) Filed: Dec. 8, 2009

(65) Prior Publication Data

US 2010/0081289 A1 Apr. 1, 2010

Related U.S. Application Data

(62) Division of application No. 11/983,239, filed on Nov. 7, 2007.

(60) Provisional application No. 60/958,193, filed on Jul. 2, 2007.

(51) Int. Cl.
*H01L 21/31* (2006.01)

(52) U.S. Cl. .......... 438/758; 257/E21.002; 257/E21.476

(58) Field of Classification Search .................. 438/758; 257/E21.002, E21.476
See application file for complete search history.

(56) References Cited

U.S. PATENT DOCUMENTS

| 3,921,575 | A | 11/1975 | Ishii et al. |
| 4,114,330 | A | 9/1978 | Sukolics |
| 4,225,638 | A | 9/1980 | Waugh |
| 4,451,507 | A | 5/1984 | Beltz et al. |
| 4,620,985 | A | 11/1986 | Goodburn et al. |
| 4,851,095 | A | 7/1989 | Scobey et al. |
| 5,588,996 | A | 12/1996 | Costello |
| 7,313,893 | B2 | 1/2008 | Voegele, Jr. |
| 7,441,379 | B2 | 10/2008 | Konstantin |
| 7,563,725 | B2 * | 7/2009 | Morad .......................... 438/758 |
| 7,600,349 | B2 | 10/2009 | Liebendorfer |
| 7,661,234 | B2 | 2/2010 | Voegele, Jr. |
| 2003/0039766 | A1 * | 2/2003 | Barnes et al. ................. 427/569 |
| 2006/0037700 | A1 | 2/2006 | Shi et al. |

* cited by examiner

*Primary Examiner* — Brook Kebede
(74) *Attorney, Agent, or Firm* — Morgan, Lewis & Bockius (57) ABSTRACT

A carrier for effectuating semiconductor processing on a non-planar substrate is disclosed. The carrier is configured for holding at least one non-planar substrate throughout a semiconductor processing step and concurrently rotating non-planar substrates as they travel down a translational path of a processing chamber. As the non-planar substrates simultaneously rotate and translate down a processing chamber, the rotation exposes the whole or any desired portion of the surface area of the non-planar substrates to the deposition process, allowing for uniform deposition as desired. Alternatively, any predetermined pattern is able to be exposed on the surface of the non-planar substrates. Such a carrier effectuates manufacture of non-planar semiconductor devices, including, but not limited to, non-planar light emitting diodes, non-planar photovoltaic cells, and the like.

11 Claims, 12 Drawing Sheets

METHOD OF DEPOSITING MATERIALS ON A NON-PLANAR SURFACE

RELATED APPLICATIONS

This application is a divisional of U.S. patent application Ser. No. 11/983,239, filed on Nov. 7, 2007 and entitled "CARRIER USED FOR DEPOSITION OF MATERIALS ON A NON-PLANAR SURFACE," hereby incorporated in its entirety.

FIELD OF THE INVENTION

The present invention is related to semiconductor processing apparatus and techniques. Specifically, the present invention is directed to semiconductor processing on non-planar surfaces using both translational and rotational geometries.

BACKGROUND OF THE INVENTION

In many conventional semiconductor processing technologies, the specific processing steps are typically performed using planar motions. For example, most integrated circuits (ICs) are typically made with machinery using solely planar motion. This is due to the implicit structure of most conventional ICs, which are almost always planar in nature. Accordingly, the necessary depositions, doping, and scribing steps are almost always performed using planar motions with the device or the IC being moved in an x or y direction.

In this manner, semiconductor processing steps can be performed on an assembly line basis with the various devices and/or substrates being moved through the various pieces of semiconductor machinery. As described herein, such semiconductor processing steps can include deposition steps such as physical deposition, chemical deposition, reactive sputtering deposition, or molecular beam epitaxy deposition. All variants of the preceding deposition families should be considered as such semiconductor processing steps.

It should be understood that the semiconductor techniques described are all well known and performed on a common basis with regards to semiconductor devices having planar features. Accordingly, the various layers that are created on the planar substrate and/or IC can be done easily and cheaply, but only if the corresponding semiconductor device is planar in nature.

Figure 1A:
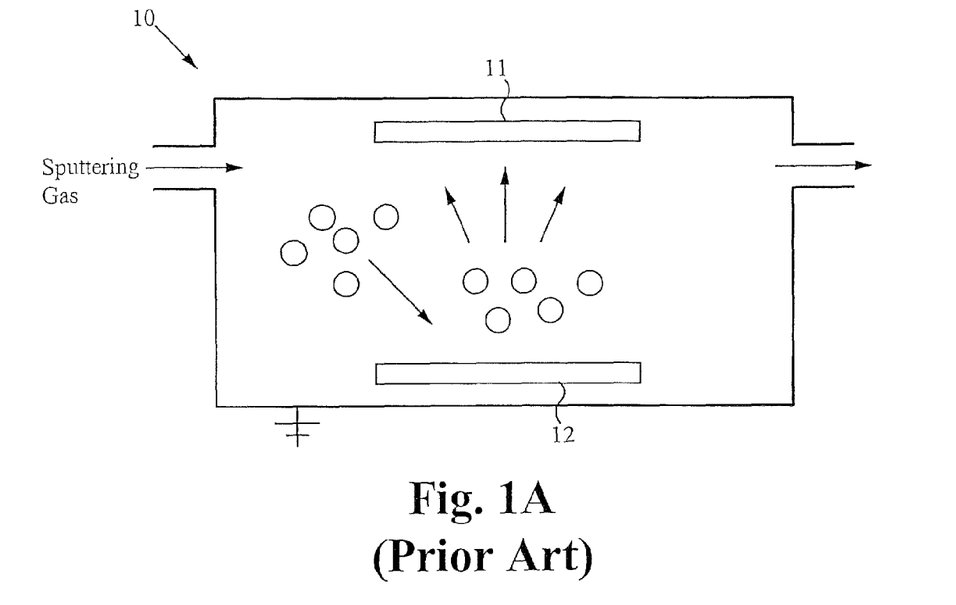
FIG. 1A shows a prior art sputter chamber for deposition of materials on a substantially planar semiconductor substrate.

Accordingly, in current practice, semiconductor manufacturing techniques and/or processing steps, such as deposition, evaporation, and scribing, although well known, are typically limited to operating on these substantially planar substrates. For example, FIG. 1A shows an exemplary prior art sputter deposition chamber 10. Sputter deposition is a method of depositing thin films onto a substrate 11 by sputtering a block of source material 12 onto the substrate 11. Sputter deposition typically takes place in a vacuum. Sputtered atoms ejected into the gas phase are not in their thermodynamic equilibrium state, and tend to deposit on all surfaces in the vacuum chamber. A substrate (such as a wafer) placed in the chamber will be coated with a thin film of the source material 12. Sputtering typically takes place with argon plasma, or another inert gas in a plasma state, as well as the target material (i.e., a semiconductive material, a metallic material, or a buffer material).

Figure 1B:
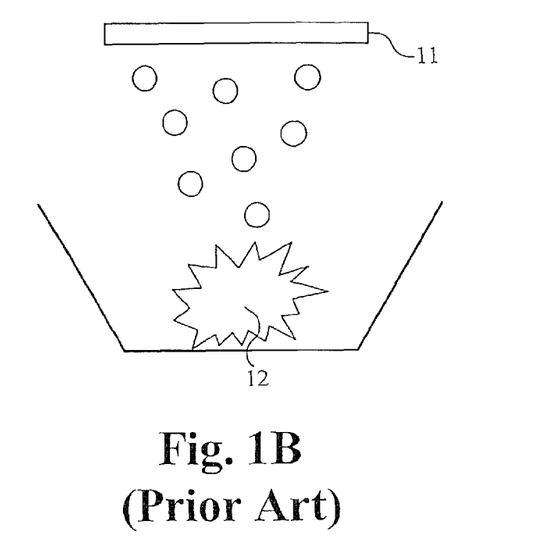
FIG. 1B shows a prior art evaporation deposition chamber.

Evaporation deposition is another common method of thin film deposition as shown in FIG. 1B. The source material 12 is exposed to a high temperature such that the material is evaporated in a vacuum. The vacuum allows vapor particles to travel directly to the target substrate, where they condense back to a solid state.

DETAILED DESCRIPTION OF THE INVENTION

Methods and apparatuses directed to deposition of semiconductor materials and other materials in the manufacture of semiconductor devices on non-planar surfaces are described herein. In general, the deposition of materials on non-planar semiconductor substrates is envisioned. In this specification and claims, the term "substrate" can refer to an actual base upon which materials common to semiconductor manufacturing are deposited, or a partially built-up device already having one or more materials already deposited. In this specification and claims, the term "non-planar" can refer to any substrate that is not substantially planar in construction (i.e., one that does not lie essentially in a two dimensional, substantially relatively flat surface). In this specification and claims, the term "carrier" can refer to a tray for effectuating semiconductor processes on a plurality of substrates.

Examples of non-planar surfaces include surfaces having an arcuate feature, or surfaces having more than one flat surface conjoined in differing two-dimensional planes. Such non-planar surfaces can include "open surfaces" (i.e., "sheets"), or "closed surfaces" (i.e., rods, tubes, among others). Such closed surfaces are able to be solid in nature (i.e., rods), hollow (i.e., tubes), and can include those surfaces having indentations (i.e., cylinders). The closed surfaces can be of any cross-sectional geometry, and such cross-section can include curved features, arcuate features, linear features, or any combination thereof. The cross-sectional geometry can include curved geometries (i.e., circles and ovals), or any linear geometry (squares, rectangles, triangles, or any n-faced geometry, regular and irregular). The previous examples of non-planar geometries are exemplary in nature, and the reader will note that many differing non-planar geometries are possible and should be considered as part of this specification. The shapes are able to be circular, ovoid, or any shape characterized by smooth curved surfaces, or any splice of smooth curved surfaces. The shapes are also able to be linear in nature, including triangular, rectangular, pentangular, hexagonal, or having any number of linear segmented surfaces. Or, the cross-section is able to be bounded by any combination of linear surfaces, arcuate surfaces, or curved surfaces.

The present disclosure will be described relative to semiconductor deposition on tubular substrates. However, it will be apparent to one of ordinary skill in the art that teachings of this disclosure are able to be directly applied to the deposition of other types of useful materials on a wide variety of non-planar surfaces. Moreover, while the teachings herein are directed toward semiconductor deposition, it will be apparent to one of ordinary skill in the art that teachings of this invention are able to be directly applied to technologies requiring deposition of materials on a variety of non-planar surfaces including, but not limited to, manufacture of non-planar photovoltaic cells, non-planar LEDs, gold plating, chrome plating, and the like. The following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The drawings may not be to scale. The same reference indicators will be used throughout the drawings and the following detailed description to refer to identical or like elements. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application, safety regulations and business related constraints, and that these specific goals will vary from one implementation to another and from one developer to another. Moreover, it will be appreciated that such a development effort will be a routine undertaking of engineering for those of ordinary skill in the art having the benefit of this disclosure.

Figure 2:
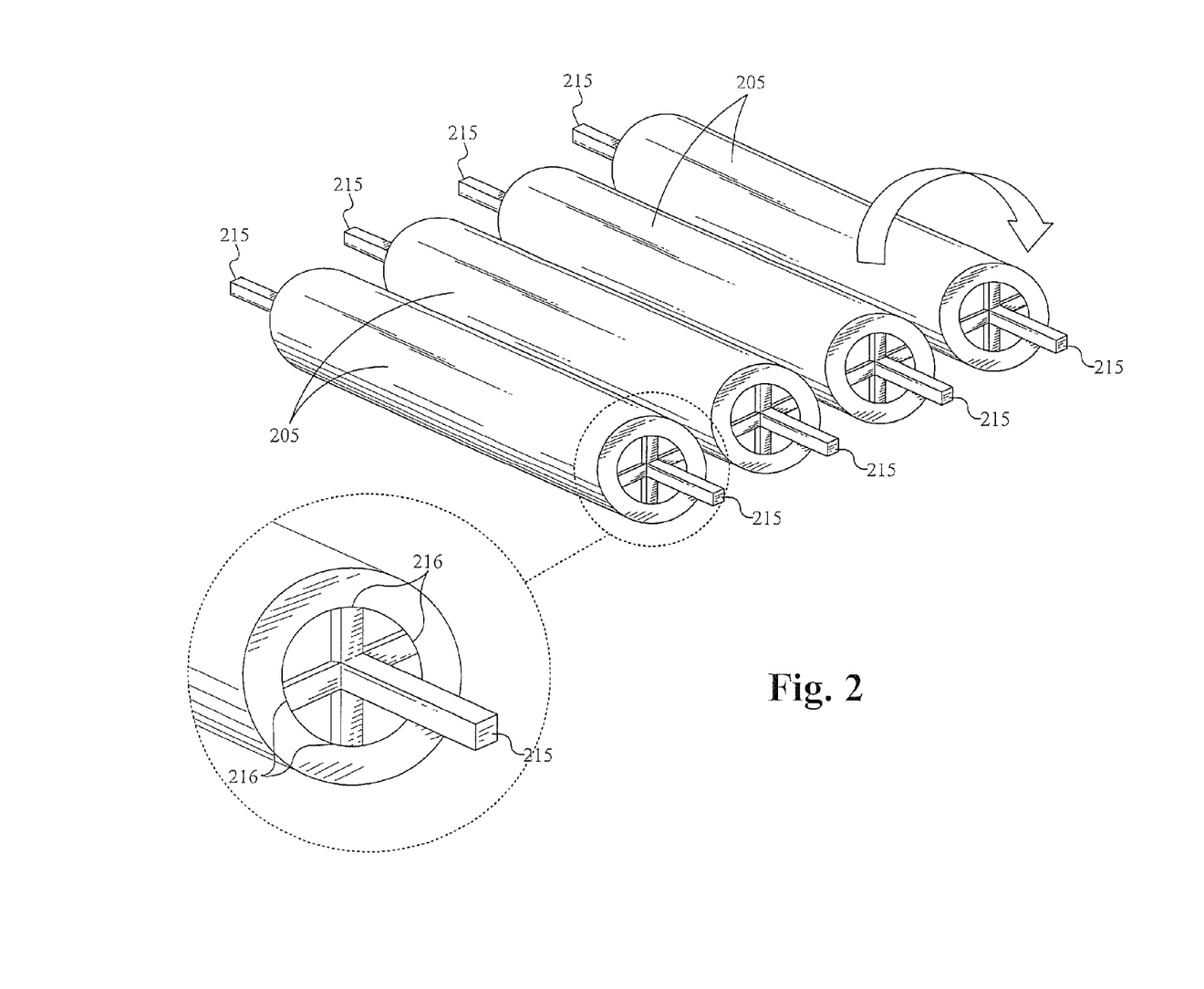
FIG. 2 shows an example of non-planar substrates per the instant disclosure.

FIG. 2 shows an example of a method and/or apparatus for depositing semiconductor materials on non-planar substrates. A non-planar substrate 205 is characterized by a cross-section bounded by any one of a number of shapes. As described herein, for ease of discussion only, a circular cross-section is described in conjunction with the described invention, but any non-planar geometry can be used. In this embodiment, the non-planar substrate 205 is hollow within its body, or has an indentation. Each non-planar substrate 205 is fitted with at least one mandrel 215. The mandrels 215 are inserted into the hollow portion or the indentation of the non-planar substrates 205. In some embodiments, the mandrels 215 couple within the hollow portion of the non-planar substrates 205 such that contact loci 216 between the mandrel 215 and the non-planar substrates 205 maintain sufficient contact and effectuate sufficient torque to allow for a rotation of the non-planar substrates 205 along a longitudinal axis without unwanted slippage, which could cause undesired or unplanned rotation. As the mandrels rotate, the substrate 205 also rotates. The contacting surface of the mandrels may be smooth. In one case, the hollow or indented features of the mandrels might have a pattern associated with it, and the mandrel might have a "locking" pattern associated with it. In this example, the substrate and the mandrel may be "mated." One example of a locking pattern would be an example of any number of "gear teeth" associated with a matched gear-tooth feature that would accomplish this locking.

Figure 3A:
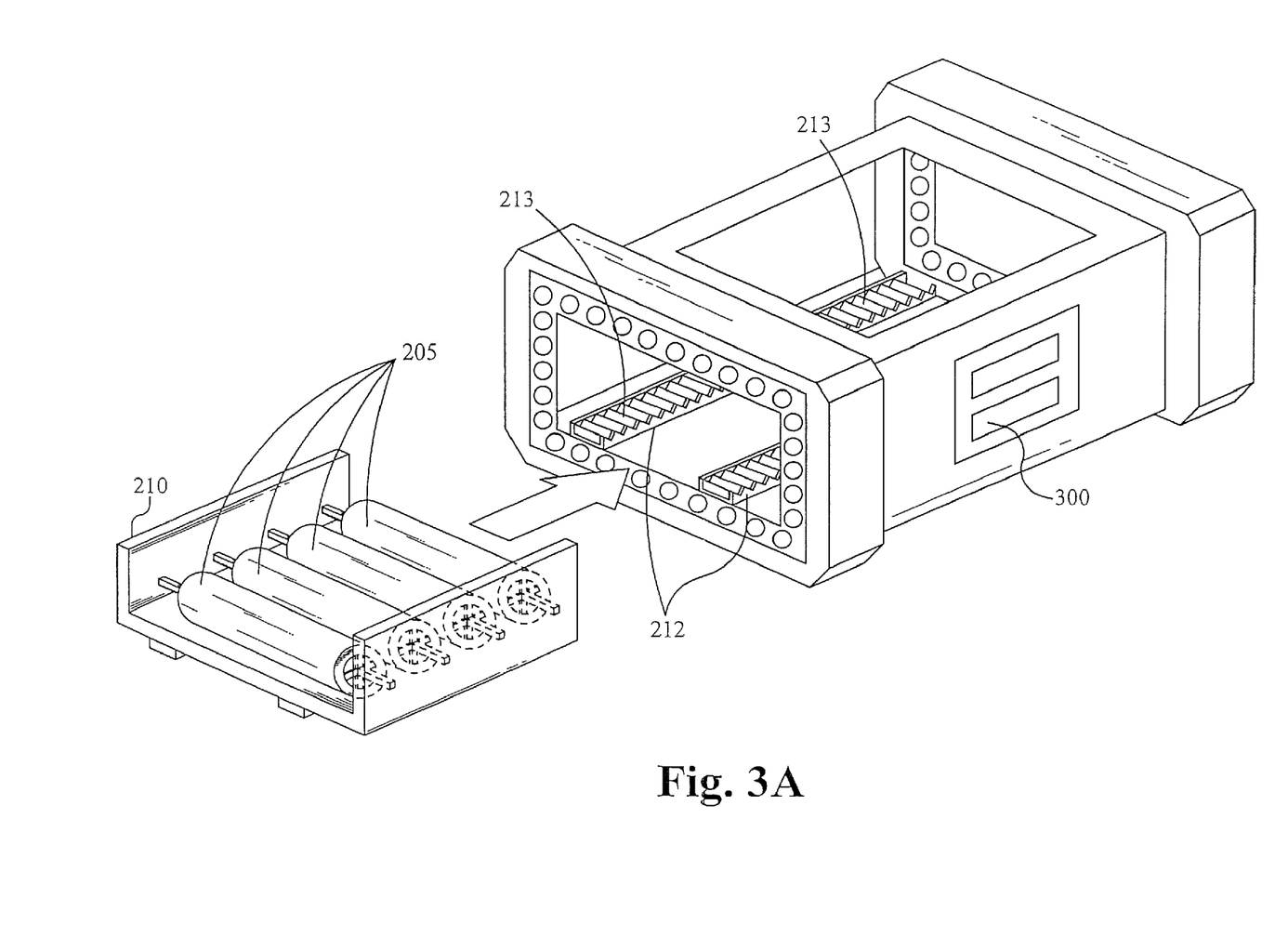
FIG. 3A shows an example of non-planar substrates being loaded into a processing chamber per the instant disclosure.

As illustrated in FIG. 3A, the non-planar substrates 205 are shown loaded onto trays 210 for processing. The tray 210 is shown carrying the non-planar substrates 205 to be loaded into an exemplary chamber 300 of a chambered deposition system. In some embodiments, the non-planar substrates 205 are fixed to the tray 210 such that a surface of the non-planar substrates is elevated from the top surface of the tray 210. Of course, the top surfaces of the substrates need not be elevated above the top surface of the tray. The top surface of the tray may be above the top surface of any substrate, below the top surface of any substrate, or coincide with the top surface of any substrate. Of course, the substrates could also have any number of orientations with respect to the top level of the tray in combination with any number with another orientation with the top level of the tray.

The exemplary deposition chamber 300 in this example can be a sputter deposition system, a reactive sputter deposition system, an evaporation deposition system or any combination thereof, where the system has at least one chamber where material is deposited on a substrate and at least one target deposition material. Alternatively, the exemplary deposition chamber 300 is able to be any chamber useful for depositing or growing thin films on a substrate. The atmospheres within the chamber can be of any sort that enables the semiconductor process, including a wide range of temperatures, wide ranges of pressures, and wide ranges of chemistries (including a lack of atmosphere as might be common in a true vacuum chamber).

In some embodiments, the chambered deposition system has an ingress and an egress, where the path between the ingress and egress determines a translational path down which the non-planar substrates 205 travel. The tray 210 is able to be loaded manually by a technician or by an automated system, or by any other convenient vehicle. In some embodiments, as the trays 210 enter and translate through the chamber 300, the mandrels 215 begin to rotate the non-planar substrates 205 along their longitudinal axes. The translation motion through the chamber can be effectuated by, for example, a linear drive mechanism 212, although any means may be used to effectuate translational motion of the substrate(s) through the processing system.

In one embodiment, the trays 210 are able to be magnetically coupled to the linear drive mechanism 212. In this case they do not physically contact the chamber 300, which may result in enhanced uniform deposition.

Figure 3B:
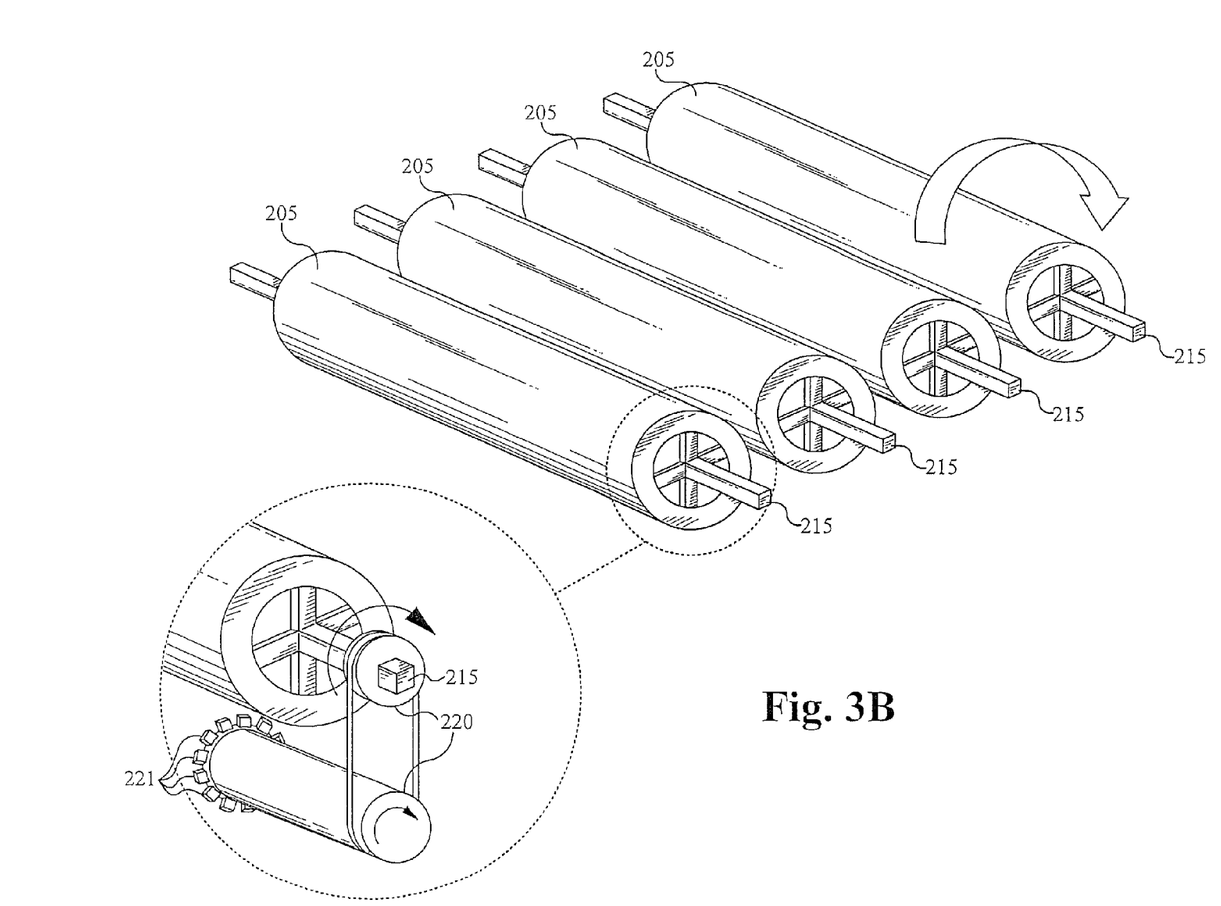
FIG. 3B shows an exemplary means for rotation per the instant disclosure.

FIG. 3B shows an exemplary embodiment of a rotation mechanism for rotating the non-planar substrates 205 as they translate down or through the chamber 300. In this exemplary embodiment, a gear and pulley system 220 is operatively coupled to the mandrel 215. In some embodiments, the gear and pulley system comprises teeth 221. Corresponding to the teeth 221, the linear drive mechanism 212 has matching teeth 213 (FIG. 3A). In some embodiments, as the tray continues in the translational direction, the teeth 221 on the gear and pulley system 220 catch the matching teeth 213 in the linear drive mechanism 212, enabling the gear and pulley system 220 to rotate the non-planar substrates 205 down the translational path. Such rotation enables deposition of a semiconductor material on the entire surface areas of the non-planar substrates 205. Alternatively, any predetermined portion of the surface area of the non-planar substrates 205 is able to be exposed to deposition. In a further alternative embodiment, any predetermined pattern is able to be deposited on the surface area. Further by way of example, in another embodiment, the teeth 220 are able to be affixed to the mandrel 215.

In another embodiment, dual sets of gear pulley systems may be used, and used to drive not just a single mandrel, but numerous mandrels at the same time. Or, a magnetic system can be used to accomplish the rotation. In this embodiment, the force used to power the rotation mechanism comes not from a physically linked source such as the gear pulley system described. The mandrels may be physically linked to a magnetic material. External magnets can be provided and rotated, thus imparting the rotation of the external magnets to the magnetic material through an associated magnetic field, where the rotation is physically imparted to the mandrel and the substrates.

In yet another embodiment, the substrate is able to be fitted into a sleeve which is coupled to a drive mechanism. The sleeve imparts the rotation force to the exterior of the substrate.

Figure 3C:
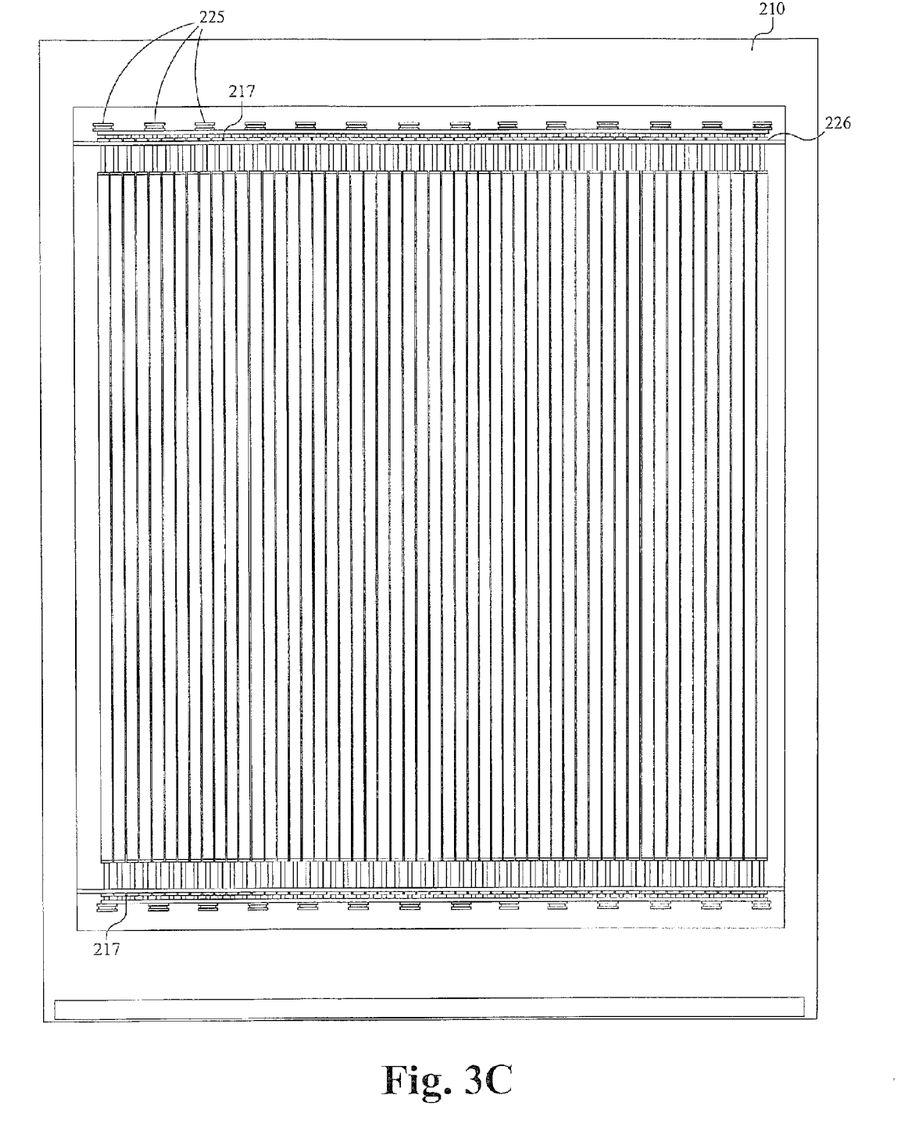
FIG. 3C shows an exemplary means for rotation per the instant disclosure.

In yet another embodiment shown in FIG. 3C, the ends of the non-planar substrates 205 are placed between rollers 225. In this exemplary embodiment, the tray 210 comprises a frame 217 to which the rollers 225 are rotatably affixed. The tray 210 is configured such that material is able to be deposited on the non-planar substrates 205 from the top direction or the bottom direction. The rollers 225 impart the rotation to the non-planar substrates 205 on the exterior of the substrate at the ends of the substrate. In some embodiments such as the example in FIG. 3C, every third non-planar substrate is affixed to a roller 225. The rollers 225 are mechanically coupled to gears 226 which rotate as the rollers 225 rotate. As the gears 226 rotate, they impart rotation on the remaining non-planar substrates 205.

Figure 3D:
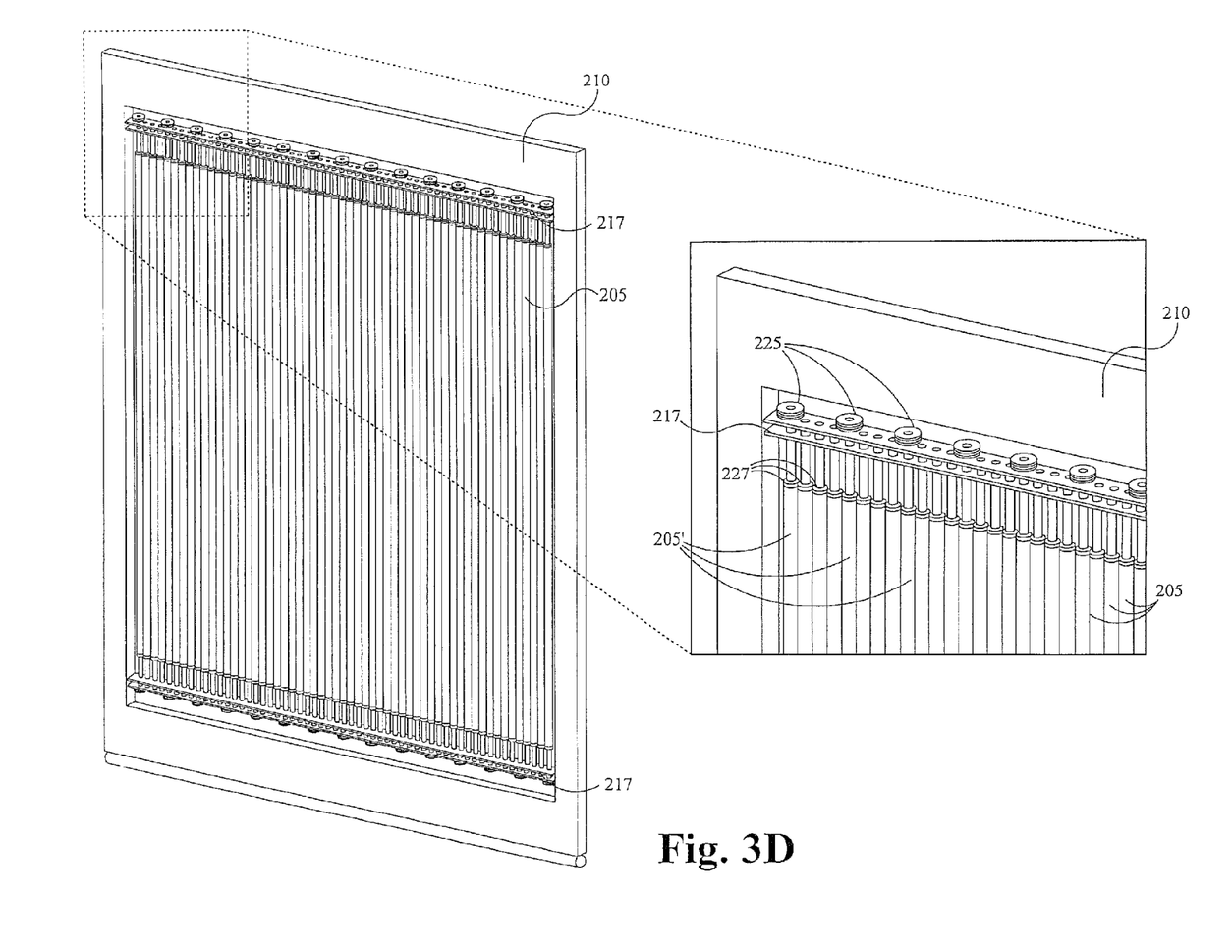
FIG. 3D shows a close up of the exemplary embodiment of FIG. 3C.

FIG. 3D shows a close up of the exemplary embodiment illustrated in FIG. 3C. The frame 217 supports the non-planar substrates 205. Every fourth non-planar substrate 205' is affixed to a roller 225. To effectuate rotation, the non-planar substrates 205 and 205' are fitted with sleeves 227 configured to transfer sufficient torque on to the ends of the non-planar substrates 205 and 205' to impart rotation without unwanted or undesired slipping.

Figure 3E:
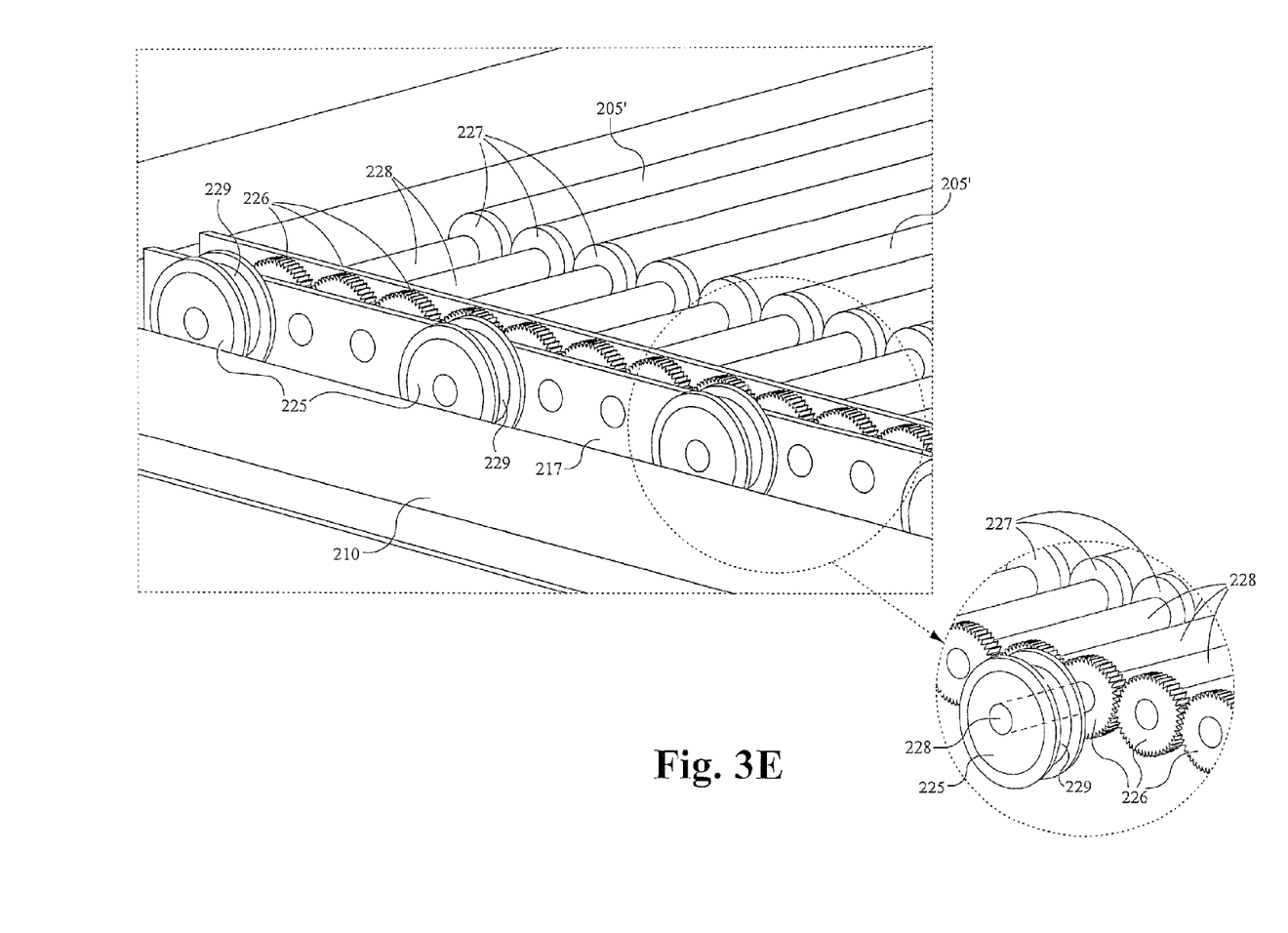
FIG. 3E shows a further close up of the exemplary embodiment of FIGS. 3C and 3D.

FIG. 3E shows a further close up view of the exemplary embodiment of FIGS. 3C and 3D. The rollers 225 are mechanically coupled to the gears 226 housed in the frame 217. In some embodiments, the rollers have grooves 229 configured to fit on tracks along a translational path in a semiconductor processing chamber. As the grooves 229 make contact with the track, the rollers 225 rotate as the tray 210 moves down a translational path through the chamber. The rollers 225 transfer motion to the gears 226. In some embodiments, each roller 225 and gear 226 is affixed to a non-planar substrate 205' and 205 by a shaft 228 which is in turn affixed to a sleeve 227 as shown in detail in the cutaway portion of the drawing. Desirably, the sleeve fits tightly over the non-planar substrate 205 so as to transfer sufficient torque to impart rotation. What is effectuated is the rotation of the non-planar substrates 205 concurrently with the translational motion of the tray 210 through a semiconductor processing chamber (not shown).

Figure 3F:
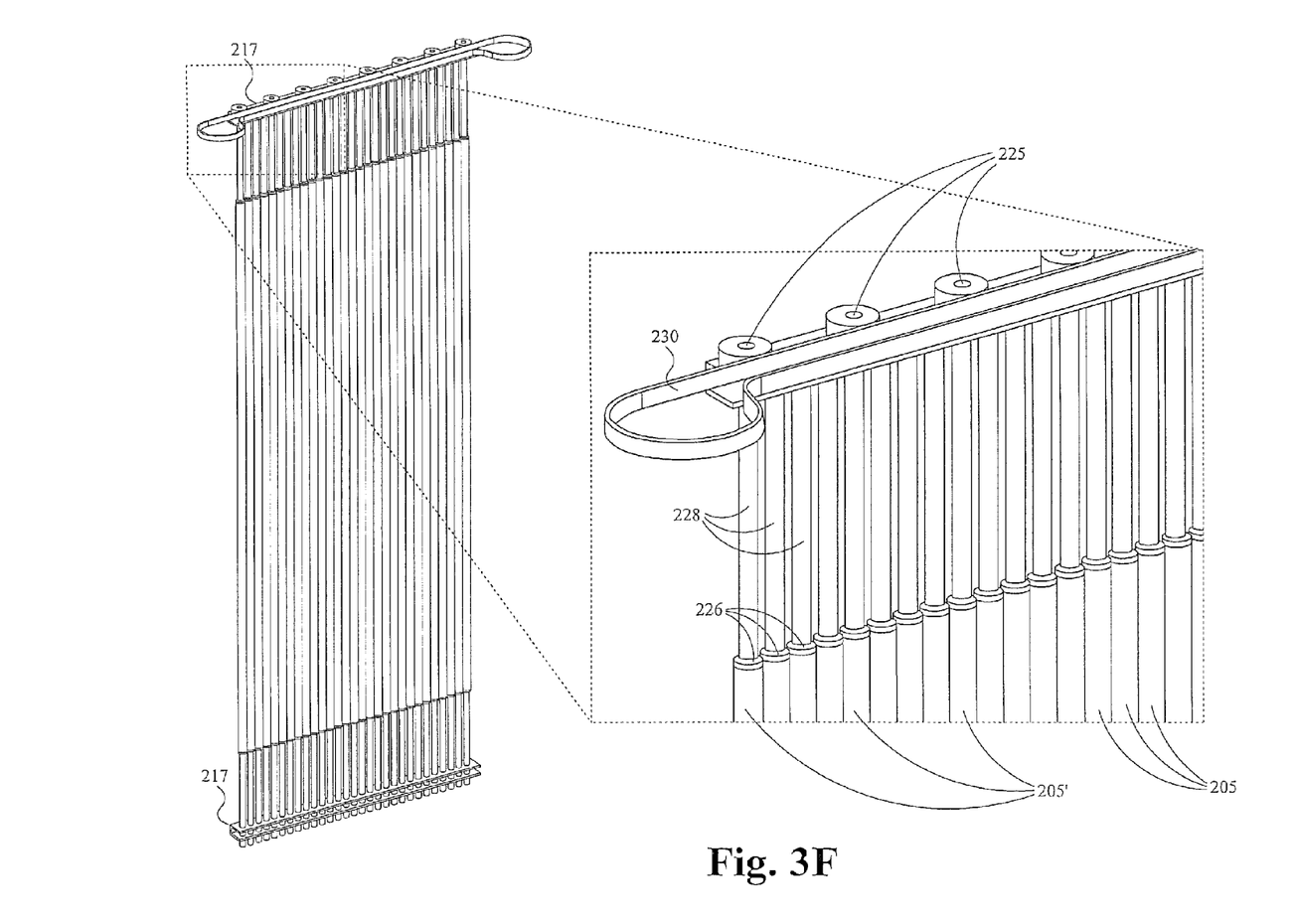
FIG. 3F shows a further exemplary means for rotation per the instant disclosure.

In another exemplary embodiment as shown in FIG. 3F, a belt 230 is used to impart rotation on the rollers 225. As described above, the rollers 225 are mechanically coupled to gears (not shown) and effectuate the rotation of the non-planar substrates 205. The belt is able to be coupled to the linear drive mechanism within the semiconductor processing chamber (not shown) or alternatively is able to be coupled to the tray 210. In some embodiments, the ends of the substrate are not exposed to the semiconductor process due to the interaction of the rollers. In some applications, the lack of deposition material at these ends may not necessarily defeat the purpose of the deposition in toto, and the rotation of the substrate by applying a force to the external surface of the substrate may be entirely appropriate.

Accordingly, it can be appreciated by those of ordinary skill in the art that other alternative means or methods of rotation are able to be incorporated herein, and many alternative means or methods of translation are able to be incorporated herein to achieve the end result of rotation of the non-planar substrates 205 during the translational motion through the chamber 300. This disclosure should be read to include those types of mechanisms to impart a rotation to the substrates.

Figure 4:
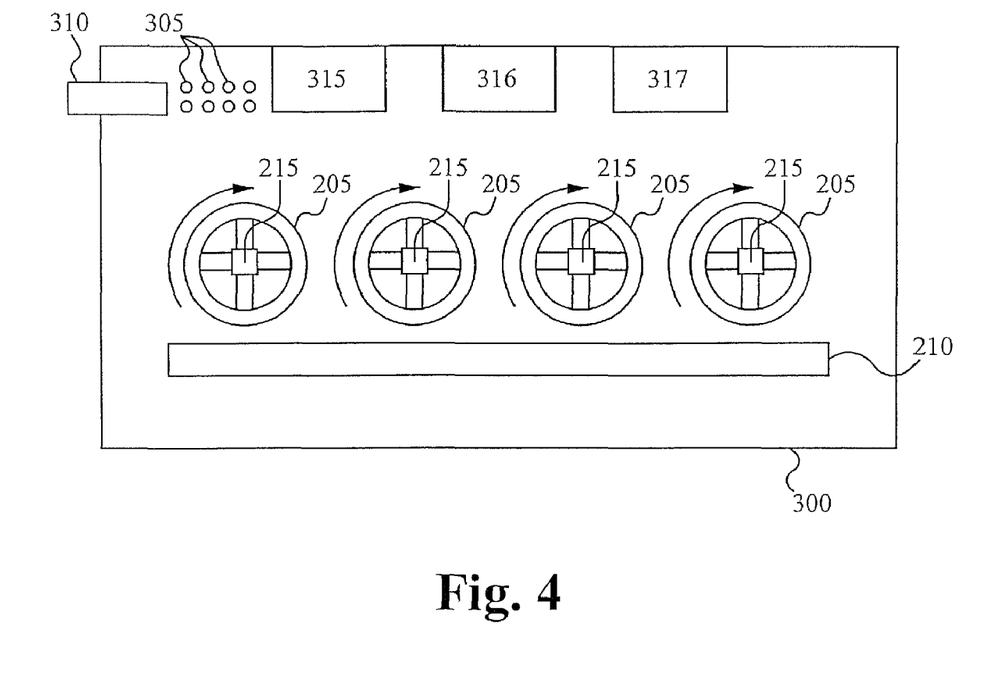
FIG. 4 shows an exemplary cross section of a processing chamber with the non-planar substrates rotating down a translational path.

FIG. 4 shows an exemplary cross section of a first deposition chamber such as the chamber 300. By way of example, the chamber 300 is the first chamber of a Copper Indium Gallium Selenide (CIGS) system. An inert plasma gas such as argon 305 is fired into the chamber 300 via an intake 310. Upon entering the chamber, the plasma gas molecules 305 collide with a sputtering target 315. By way of example, the sputter targets 315, 316 and 317 are Selenium, Copper and Indium respectively. As the inert plasma gas 305 bombards the targets 315, 316, 317, molecules of the target materials leave thermal equilibrium and begin coating all surfaces within the chamber 300. In some embodiments, the non-planar substrates 205 continue rotating about their longitudinal axes as they translate through the chamber 300, such that the whole of their outer surface areas will be coated by the molecules of the sputtering targets 315, 316, 317. The rates of rotation as well as the rate of translation through the chamber 300 are able to be predetermined as functions of the sputtering target materials, the ambient temperature, the temperature and kinetic energy of the plasma gas 305 and the desired thickness of the coating upon non-planar substrates 205, among other factors.

Control and measurement systems can be used to manage and control the rates of translation and rotation. The rates can be constant, or dynamic. The relationship between the rate of translation and a rate of rotation can be fixed, such as depicted in the system employing the gear-pulley system. The relationship between the rate of translation and rotation can be varied and/or controlled, such as varying the rate of rotation in the magnetically coupled system. The rate of translation and the rate of rotation can be coupled or can be independent. When each substrate is individually rotated, the rates between differing substrates can be the same or differing. The rotation can be analog in nature, or can occur in discrete steps. The translation can be analog in nature, or occur in discrete steps. Further, both the rotation and the translation can occur individually as analog, individually as discrete steps, or in varying combinations.

Figure 5A:
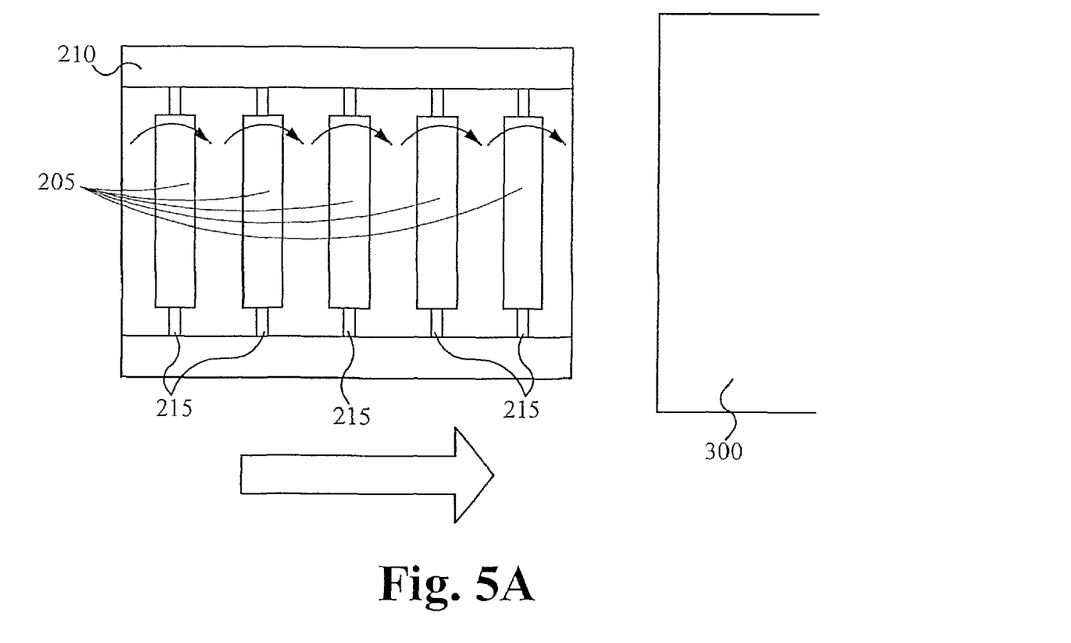
FIG. 5A shows an exemplary combination of rotation and translation of the non-planar substrates.
Figure 5B:
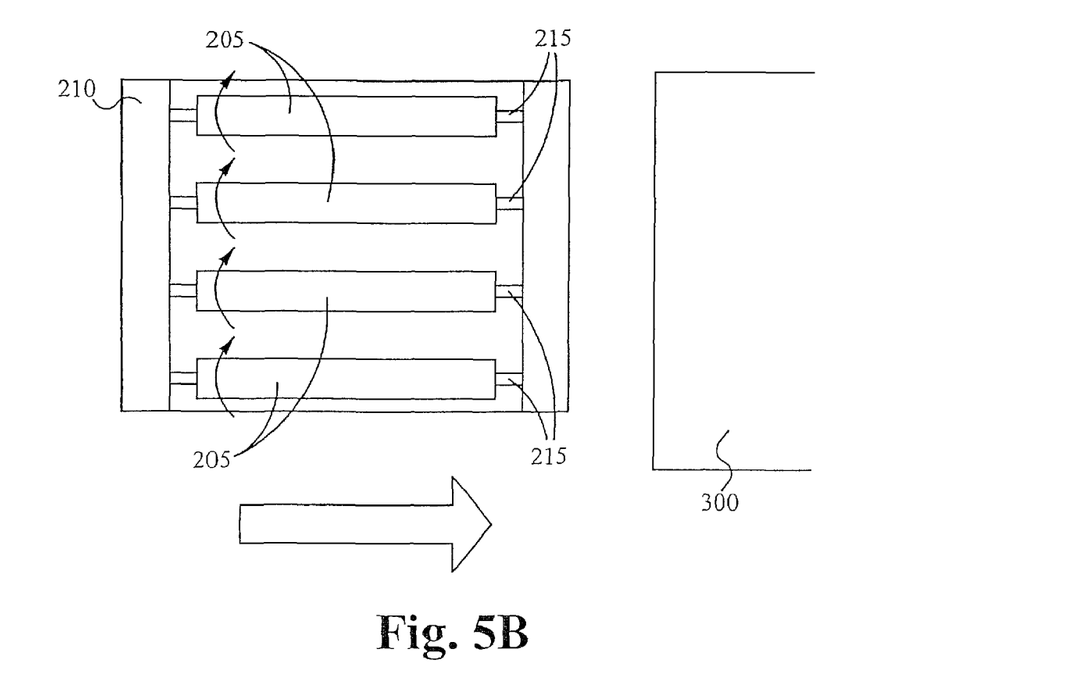
FIG. 5B shows an exemplary combination of rotation and translation of the non-planar substrates.

FIGS. 5A and 5B show exemplary rotation and translation combinations for the non-planar substrates 205 as they enter and move through the chamber 300. In some embodiments, the non-planar substrates 205 are rotating about their longitudinal axes via mandrels 215 fixed to the tray 210. In FIG. 5A, the non-planar substrates 205 translate through the chamber 300 lengthwise as they rotate. In FIG. 5B, the non-planar substrates 205 translate through the chamber 300 widthwise. In both exemplary embodiments, the non-planar substrates 205 rotate concurrently and/or simultaneously as they translate through the chamber 300.

Figure 6A:
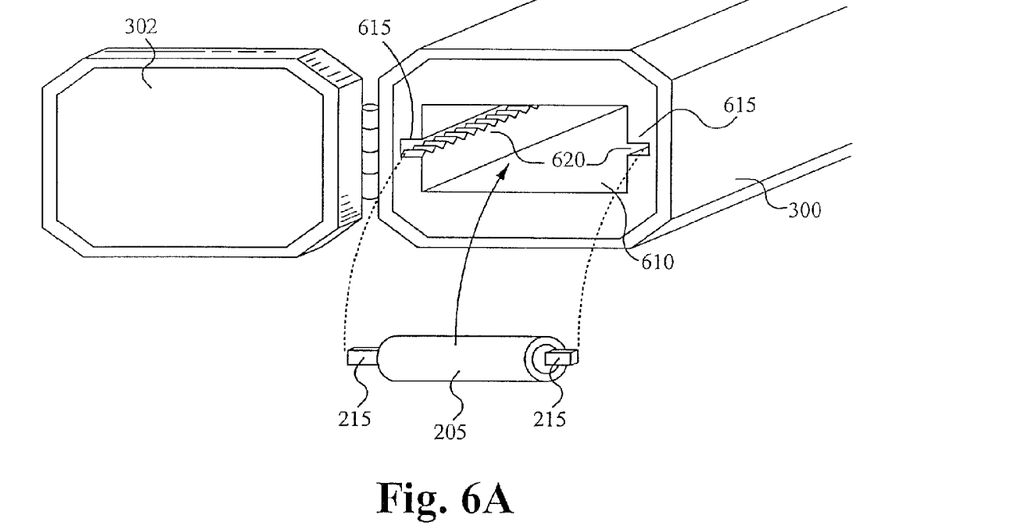
FIG. 6A shows an alternate embodiment of the present invention.
Figure 6B:
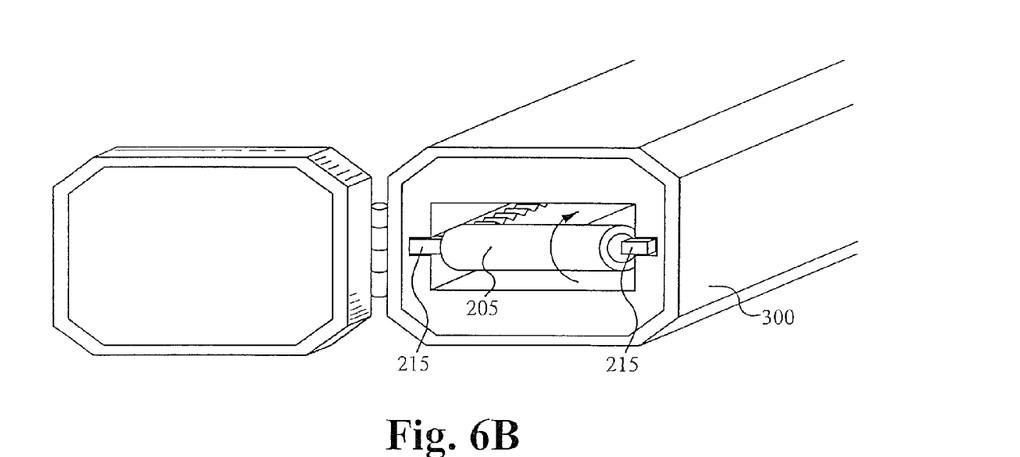
FIG. 6B shows another aspect of the alternate embodiment of FIG. 6A.

FIG. 6A shows a further embodiment of the present invention. Non-planar substrates 205 are individually loaded into a processing chamber 300. In this example, the chamber 300 comprises a door 302 capable of hermetic sealing. By way of example, the processing chamber 300 is a CIGS sputter deposition chamber. Alternatively, the processing chamber 300 is able to be any convenient chamber to suit processing needs for a given application. In this exemplary embodiment, the non-planar substrates 205 are affixed with mandrels 215 into the hollow portion of their bodies. In some embodiments, the mandrels 215 couple within the hollow portion of the non-planar substrates 205 such that the contact between the mandrel 215 and the non-planar substrates 205 maintains sufficient contact and effectuate sufficient torque to allow for a rotation of the non-planar substrates 205 without unwanted slipping causing undesired or unplanned rotation. The mandrels 215 protrude outward from the non-planar substrates 205. In this alternative embodiment, the ingress 610 of the chamber 300 comprises inlets 615 which open to tracks 620 down the length of the chamber 300. The inlets 615 are preferably configured to accept the mandrels 215 affixed to the non-planar substrates 205. When the mandrels 215 are inserted into inlets 615, a linear drive mechanism effectuates translation down the length of the chamber 300. In some embodiments, the linear drive mechanism further effectuates rotation of the non-planar substrates 205 along their lengthwise axis, such that molecules of a sputter target are exposed to the whole of the surfaces of the non-planar substrates 205. As stated above, the rates of translation as well as rotation of the non-planar substrates 205 can be functions of the desired deposition thickness on the surface of the non-planar substrates 205, the ambient temperature of the chamber 300, the kinetic energy of the sputtering gas, or the physical properties of the target material. FIG. 6B shows the non-planar substrate 205 rotating down the translational path of the chamber 300.

Figure 7:
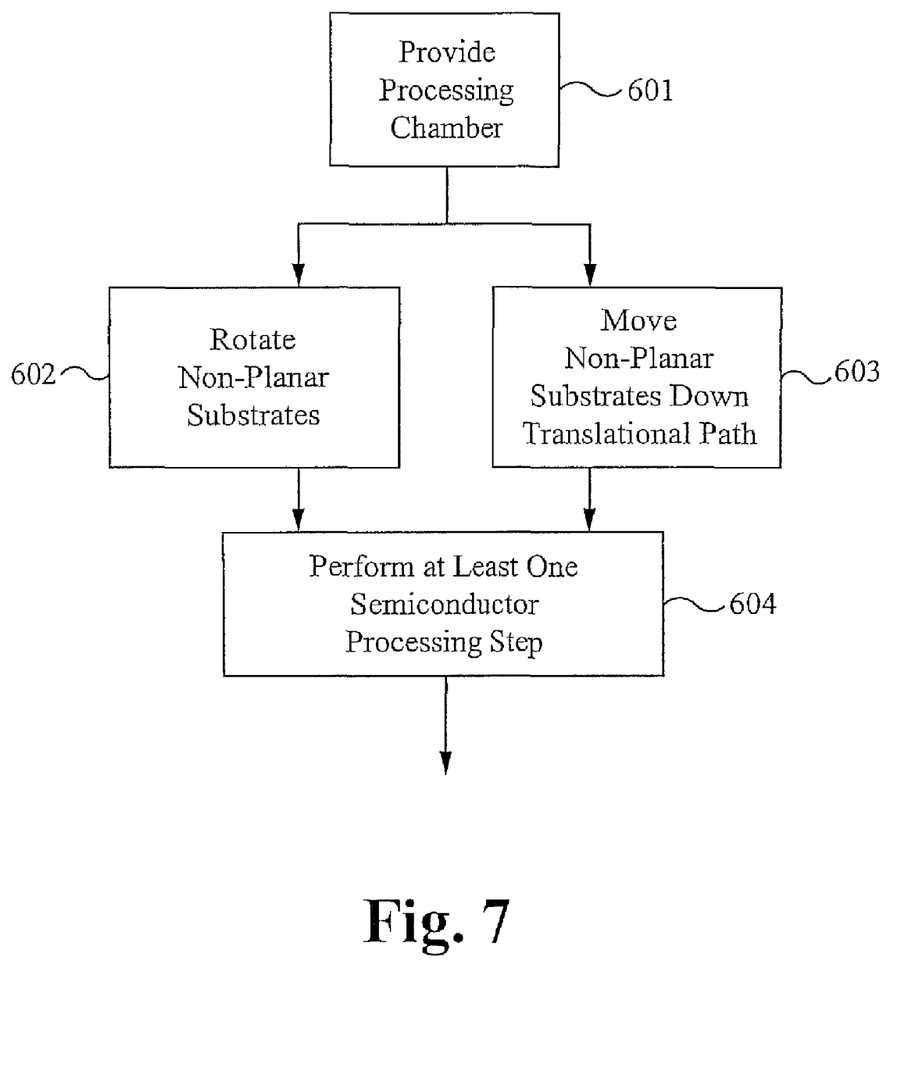
FIG. 7 shows a block diagram of a method of depositing material on a non-planar substrate.

FIG. 7 shows a block diagram for the method of depositing materials on a non-planar substrate. Step 601 comprises providing a processing chamber. The processing chamber is able to be a sputter deposition chamber, a reactive deposition chamber, or any deposition chamber called for by a desired application. Step 602 comprises providing means for rotating the non-planar substrates about a longitudinal axis. In some embodiments, step 602 occurs concurrently with the step 603. Step 603 comprises moving the non-planar substrates down a translational path. A translational path is defined as the path between the ingress and egress of the processing chamber. The non-planar substrates are able to translate down the path either lengthwise or widthwise. Step 604 comprises performing at least one semiconductor processing step. In some embodiments, the step of performing at least one semiconductor processing step 604 is done simultaneously with the steps 602 and 603.

In operation, the present invention is able to be used to manufacture non-planar semiconductor devices by rotating non-planar substrates as they move down a translational path of a processing chamber. Rotation and translation are able to be effectuated by any known or convenient means, including, but not limited to a linear drive mechanism and a gear and pulley mechanism. The combination of rotational and translational motion provides for deposition of materials on the outer surface of the non-planar substrate during processing. Alternatively, such a rotational and translational processing system is able to be applied to powdercoating, chrome plating, or other metal plating. In semiconductor-related applications, a tubular substrate is able to be processed into a tubular, non-planar light emitting diode (LED). Further by way of example, a tubular substrate is able to be processed into a non-planar photovoltaic cell. Such a photovoltaic cell is able to have a greater surface area incidental to the sun's rays allowing for greater current generation.

A carrier for effectuating semiconductor processing on a non-planar substrate is disclosed. The carrier is configured for holding at least one non-planar substrate throughout a semiconductor processing step and concurrently rotating non-planar substrates as they travel down a translational path of a processing chamber. As the non-planar substrates simultaneously rotate and translate down a processing chamber, the rotation exposes the whole or any desired portion of the surface area of the non-planar substrates to the deposition process, allowing for uniform deposition as desired. Alternatively, any predetermined pattern is able to be exposed on the surface of the non-planar substrates. Such a carrier effectuates manufacture of non-planar semiconductor devices, including, but not limited to, non-planar light emitting diodes, non-planar photovoltaic cells, and the like.

In a first aspect, a carrier carries at least one semiconductor substrate through a processing chamber in a translational path comprising a rotating mechanism for rotating the at least one semiconductor substrate. The at least one substrate is rotated concurrently as it is carried through a processing chamber. The at least one substrate is non-planar. In some embodiments, a rate of rotation is determined as a function of variables from among a list comprising type and process temperature, deposited material, desired deposition thickness, ambient temperature within the process chamber, quality of a vacuum condition within the process chamber and desired deposition area. In some embodiments, the processing chamber comprises a semiconductor processing chamber. In some embodiments, a rate of translation is determined as a function of variables from among a list comprising type and process temperature, deposited material, desired deposition thickness, ambient temperature within the process chamber, quality of a vacuum condition within the process chamber and desired deposition area. In some embodiments, the semiconductor processing chamber is any among a list comprised of a sputter deposition chamber, a reactive sputter deposition chamber, and an evaporation deposition chamber. In some embodiments, the rotating mechanism rotates the at least one semiconductor substrate about a lengthwise axis.

In another aspect, a carrier carries at least one non-planar substrate through a processing chamber comprising a frame, a roller, wherein the roller is rotatably coupled to the frame, a gear, wherein the gear is rotatably coupled to the frame such that the gear rotates as the roller rotates and, a shaft coupled on a first end to the roller and the gear and coupled on a second end to at least one non-planar substrate effectuating rotation of the at least one non-planar substrate as the roller and gear rotates. In some embodiments, the roller comprises a groove configured to receive a track in a processing chamber, wherein the track travels along a translational path. In some embodiments, the shaft is coupled to the at least one non-planar substrate by a sleeve configured to fit tightly over an end of the at least one non-planar substrate such as to effectuate sufficient torque for the shaft to rotate the non-planar substrate. In some embodiments, the at least one non-planar substrate is a semiconductor substrate. In some embodiments, the roller is coupled to a belt effectuating rotation of the rollers.

In still another aspect, a method of forming a semiconductor device, comprises providing a semiconductor process chamber having an ingress and an egress, wherein the ingress and egress are operable to allow passage of a carrier carrying at least one non-planar substrate therethrough, moving the carrier through the semiconductor process chamber, wherein moving comprises rotating the at least one non-planar substrate within the carrier and translating the carrier down a translational path through the semiconductor process chamber and concurrently while moving the carrier through the semiconductor process chamber, performing at least one semiconductor process on the at least one non-planar substrate. In some embodiments, a path between the ingress and egress is the translational path. In some embodiments, a rate of rotation is determined as a function of variables from among a list comprised of type and process temperature, deposited material, desired deposition thickness, ambient temperature within the process chamber, quality of a vacuum condition within the process chamber and desired deposition area. In some embodiments, a rate of translation is determined as a function of variables from among a list comprised of type and process temperature, deposited material, desired deposition thickness, ambient temperature within the process chamber, quality of a vacuum condition within the process chamber and desired deposition area. In some embodiments, the semiconductor process chamber comprises a deposition chamber. In some embodiments, the rotation comprises rotating the at least one non-planar substrate about a lengthwise axis.

In yet another aspect, a method of depositing material on a non-planar surface, comprises providing a deposition chamber having an ingress and an egress, wherein the ingress and egress are operable to allow passage of a carrier carrying at least one non-planar substrate therethrough, moving the at carrier down a translational path through the deposition chamber and rotating the at least one non-planar substrate as the carrier moves down the translational path through the deposition chamber and, performing at least one semiconductor deposition on the at least one non-planar substrate concurrently with the rotation of the at least one non-planar substrate down the translational path such that at least a portion of the surface area of the at least one non-planar substrate is exposed to the semiconductor deposition. In some embodiments, a path between the ingress and egress is the translational path. In some embodiments, a rate of rotation is determined as a function of variables from among a list comprised of type and process temperature, deposited material, desired deposition thickness, ambient temperature within the process chamber, quality of a vacuum condition within the process chamber and desired deposition area. In some embodiments, a rate of translation is determined as a function of variables from among a list comprised of type and process temperature, deposited material, desired deposition thickness, ambient temperature within the process chamber, quality of a vacuum condition within the process chamber and desired deposition area. In some embodiments, rotating comprises rotating the at least one non-planar substrate about a lengthwise axis.

The present application has been described in terms of specific embodiments incorporating details to facilitate the understanding of the principles of deposition of materials on a non-planar surface. Many of the components shown and described in the various figures are able to be interchanged to achieve the results necessary, and this description should be read to encompass such interchange as well. As such, references herein to specific embodiments and details thereof are not intended to limit the scope of the claims appended hereto.

We claim:

1. A method of forming a semiconductor device, comprising:
   a. providing a semiconductor process chamber having an ingress and an egress, wherein the ingress and egress are operable to allow passage of a carrier carrying at least one non-planar substrate therethrough;
   b. moving the carrier through the semiconductor process chamber, wherein moving comprises:
      i. rotating the at least one non-planar substrate within the carrier; and
      ii. translating the carrier down a translational path through the semiconductor process chamber; and
   c. concurrently while moving the carrier through the semiconductor process chamber, performing at least one semiconductor process on the at least one non-planar substrate.

2. The method of claim 1 wherein a path between the ingress and egress is the translational path.

3. The method of claim 1 wherein a rate of rotation is determined as a function of variables from among a list comprised of type and process temperature, deposited material, desired deposition thickness, ambient temperature within the process chamber, quality of a vacuum condition within the process chamber and desired deposition area.

4. The method of claim 1 wherein a rate of translation is determined as a function of variables from among a list comprised of type and process temperature, deposited material, desired deposition thickness, ambient temperature within the process chamber, quality of a vacuum condition within the process chamber and desired deposition area.

5. The method of claim 1 wherein the semiconductor process chamber comprises a deposition chamber.

6. The method of claim 1 wherein the rotation comprises rotating the at least one non-planar substrate about a lengthwise axis.

7. A method of depositing material on a non-planar surface, comprising:
   a. providing a deposition chamber having an ingress and an egress, wherein the ingress and egress are operable to allow passage of a carrier carrying at least one non-planar substrate therethrough;
   b. moving the carrier down a translational path through the deposition chamber; and
   c. rotating the at least one non-planar substrate as the carrier moves down the translational path through the deposition chamber; and,
   d. performing at least one semiconductor deposition on the at least one non-planar substrate concurrently with the rotation of the at least one non-planar substrate down the translational path such that at least a portion of the surface area of the at least one non-planar substrate is exposed to the semiconductor deposition.

8. The method of claim 7 wherein a path between the ingress and egress is the translational path.

9. The method of claim 7 wherein a rate of rotation is determined as a function of variables from among a list comprised of type and process temperature, deposited material, desired deposition thickness, ambient temperature within the process chamber, quality of a vacuum condition within the process chamber and desired deposition area.

10. The method of claim 7 wherein a rate of translation is determined as a function of variables from among a list comprised of type and process temperature, deposited material, desired deposition thickness, ambient temperature within the process chamber, quality of a vacuum condition within the process chamber and desired deposition area.

11. The method of claim 7 wherein rotating comprises rotating the at least one non-planar substrate about a lengthwise axis.

* * * * *